(12) United States Patent
LaBerge et al.

(10) Patent No.: US 7,277,996 B2
(45) Date of Patent: *Oct. 2, 2007

(54) MODIFIED PERSISTENT AUTO PRECHARGE COMMAND PROTOCOL SYSTEM AND METHOD FOR MEMORY DEVICES

(75) Inventors: Paul A. LaBerge, Shoreview, MN (US); Jeffery W. Janzen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/417,388

(22) Filed: May 3, 2006

(65) Prior Publication Data

US 2006/0203584 A1 Sep. 14, 2006

Related U.S. Application Data (63) Continuation of application No. 10/228,781, filed on Aug. 26, 2002, now Pat. No. 7,124,260.

(51) Int. Cl.
*G06F 12/00* (2006.01)
(52) U.S. Cl. .................. 711/155; 711/106; 365/202; 365/203
(58) Field of Classification Search ............. 711/155, 711/106; 365/202, 203
See application file for complete search history.

(56) References Cited

U.S. PATENT DOCUMENTS

| | | | |
|---|---|---|---|
| 5,555,526 A | 9/1996 | Kim | 365/203 |
| 5,636,173 A | 6/1997 | Schaefer | 365/230.03 |
| 5,715,203 A | 2/1998 | Uchida | 365/203 |
| 5,748,560 A | 5/1998 | Sawada | 365/233 |
| 5,889,714 A | 3/1999 | Schumann et al. | 365/203 |
| 6,181,619 B1 | 1/2001 | Bogin et al. | 365/203 |
| 6,343,040 B2 | 1/2002 | Bae | 365/203 |
| 6,470,433 B1 | 10/2002 | Prouty et al. | 711/168 |
| 6,473,347 B2 | 10/2002 | Mori et al. | 365/203 |
| 6,507,526 B2 | 1/2003 | Ohtake | 365/203 |
| 6,564,281 B2 | 5/2003 | Farmwald et al. | 710/305 |
| 6,636,449 B2 | 10/2003 | Matsuzaki | 365/222 |
| 6,661,721 B2 | 12/2003 | Lehmann et al. | 365/203 |
| 6,762,958 B2 | 7/2004 | Schramm et al. | 365/189.07 |
| 6,823,485 B1 | 11/2004 | Muranaka | 714/719 |
| 2001/0008496 A1 | 7/2001 | Leung | 365/223 |
| 2001/0017805 A1 | 8/2001 | Jang et al. | 365/202 |
| 2001/0021136 A1 | 9/2001 | Bae | 365/203 |
| 2001/0036117 A1 | 11/2001 | Mullarkey | 365/222 |
| 2001/0038565 A1 | 11/2001 | Matsuzaki | 365/222 |
| 2002/0001244 A1 | 1/2002 | Ohtake | 365/203 |
| 2002/0141267 A1 | 10/2002 | Choi | 365/222 |
| 2002/0159318 A1 | 10/2002 | Arimoto et al. | 365/203 |
| 2003/0076726 A1 | 4/2003 | Cowles et al. | 365/222 |
| 2003/0081483 A1 | 5/2003 | De Paor et al. | 365/222 |
| 2003/0151965 A1 | 8/2003 | Jones, Jr. | 365/222 |
| 2003/0161207 A1 | 8/2003 | Jones, Jr. et al. | 365/222 |

*Primary Examiner*—Pierre Bataille
*Assistant Examiner*—Sheng-Jen Tsai
(74) *Attorney, Agent, or Firm*—Dorsey & Whitney LLP (57) ABSTRACT

A method of operating a memory device includes placing the memory device in a persistent auto precharge mode of operation, applying a disable command to the memory device, and disabling the persistent auto precharge mode of operation in response to the applied disable command. Memory devices operating according this method may be used in memory systems that infrequently experience page hits, such as server systems, while the ability to disable the persistent auto precharge mode allows such memory devices to be used in systems that frequently experience page hits, such as graphics or input/output applications.

82 Claims, 9 Drawing Sheets

MODIFIED PERSISTENT AUTO PRECHARGE COMMAND PROTOCOL SYSTEM AND METHOD FOR MEMORY DEVICES

CROSS-REFERENCE TO RELATED APPLICATION

This application is a continuation of U.S. patent application No. 10/228,781, filed Aug. 26, 2002 now U.S. Pat. No. 7,124,260.

TECHNICAL FIELD

The present invention relates generally to integrated circuits, and more specifically to increasing throughput in memory systems.

BACKGROUND OF THE INVENTION

A conventional computer system includes a processor that retrieves or reads program instructions from a memory system through a memory controller and executes the program instructions to perform a corresponding function. The processor also transfers data to and from the memory system via the controller during execution of the program instructions. The amount of data and program instructions that are transferred between the processor and the memory system in a specified amount of time is known as the throughput of the memory system. The higher the throughput of the memory system, the faster the processor executes a particular program and thus the faster the operation of the computer system.

Figure 1:
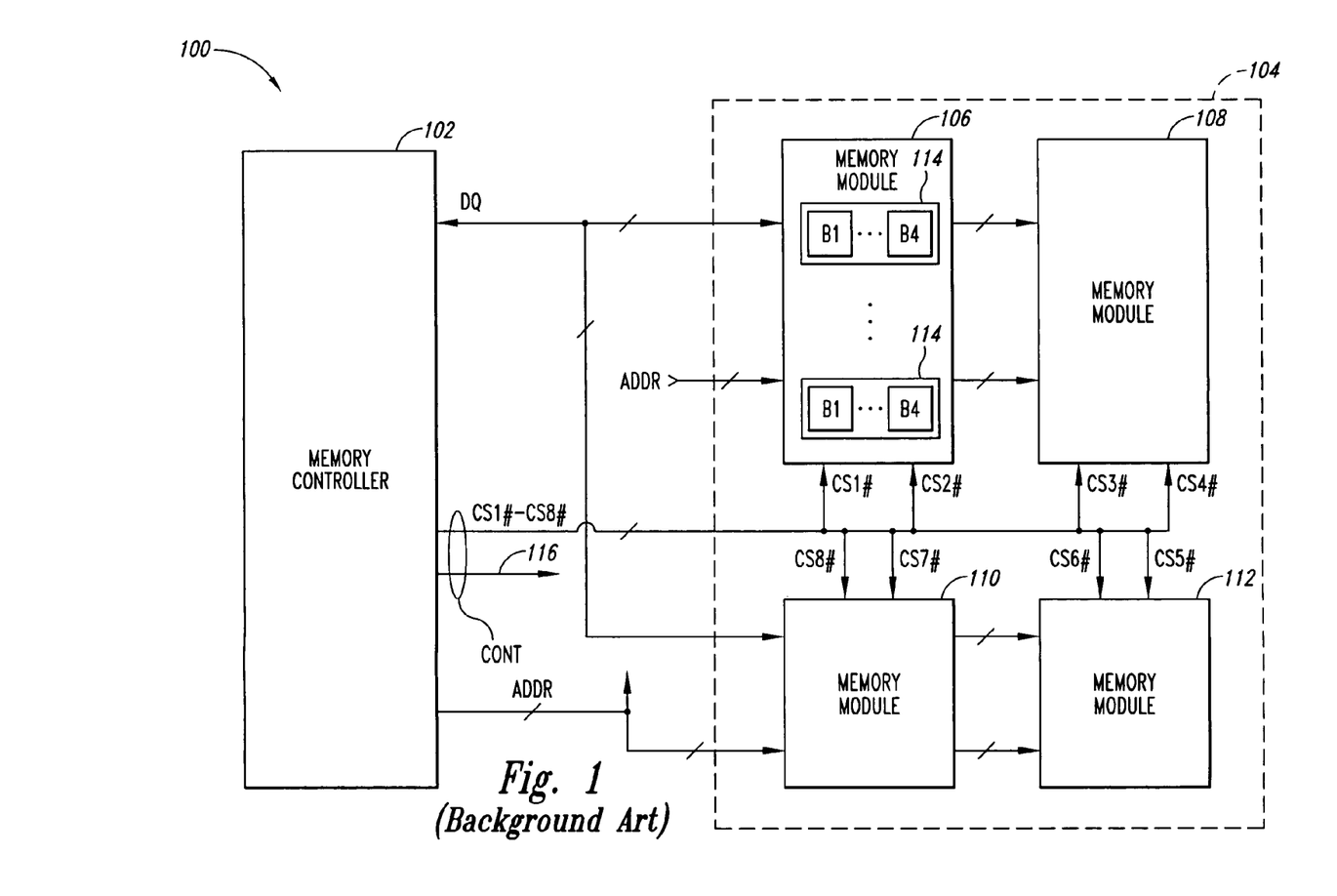
FIG. 1 is a functional block diagram illustrating a memory system including a memory controller and a memory formed by a plurality of memory modules.

FIG. 1 illustrates a portion of a conventional memory system 100 including a memory controller 102 coupled to a memory 104 over a data bus DQ, an address bus ADDR, and a control bus CONT. The memory 104 includes four memory modules 106-112, each memory module including a plurality of memory devices 114 which, in turn, each includes four memory banks B1-B4. Each memory bank B1-B4 includes a plurality of memory cells (not shown) arranged in rows and columns, as will be understood by those skilled in the art. In the example of FIG. 1, each memory module 106-112 receives two corresponding chip select signals CS1#-CS8# from the memory controller 102 over the CONT bus, with the memory devices 114 on each module receiving one of the two applied chip select signals. A group of memory devices 114 on a memory module 106-112 that receive the same chip select signal CS1#-CS8# is known as a rank of memory, with the memory modules 104 collectively including eight ranks R1-R8 that receive the chip select signals CS1#-CS8#, respectively. E04, each memory module 106-112 contains two ranks of memory defined by two groups of memory devices 114 on the module that receive one of the two applied chip select signals CS1#-CS8#.

Figure 2:
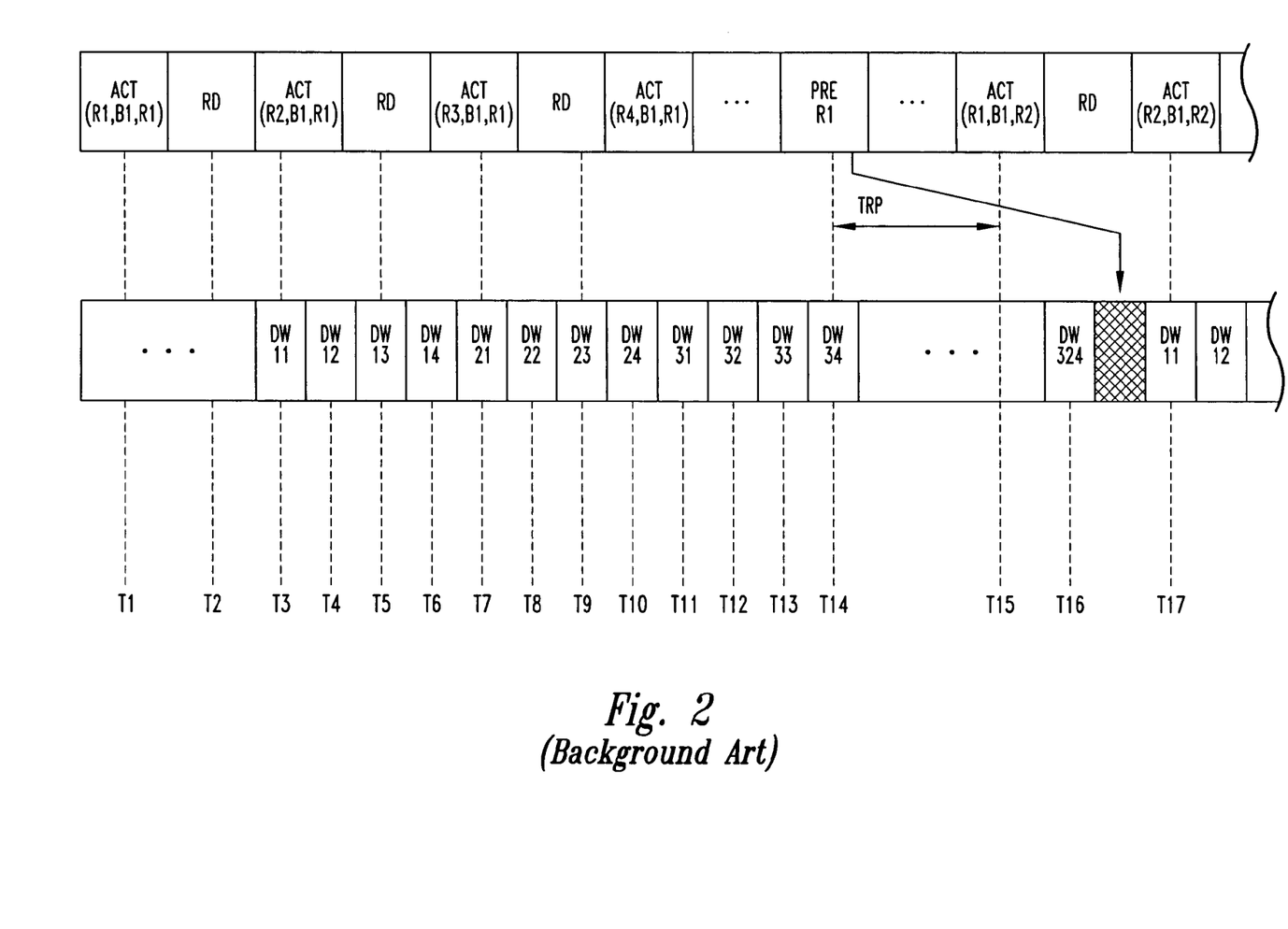
FIG. 2 is a signal diagram showing the effects of precharge operations on the transfer of data between memory controller and the memory modules.

The operation of the memory system 100 during read operations will now be described in more detail with reference to the signal timing diagram of FIG. 2. In operation, the memory controller 102 applies a command to the memory modules 106-112 in the form of address signals on the address bus ADDR and control signals 116 along with the chip select signals CS1#-CS8# on the control bus CONT. The memory controller 102 activates only one chip select signal CS1#-CS8# at a time and only the rank receiving the activated chip select signal response to be applied command. At a time T1, the memory controller 102 initially applies a row or active command ACT including specific row and bank addresses to access a specific row in a specific bank in a specific rank of memory. In the example of FIG. 2, the memory controller 102 applies an ACT command to activate rank R1 (the group of memory devices 114 on the memory module 106 coupled to chip select CS1#), bank B1, and row R1. The memory controller 102 thereafter applies a burst read command RD at a time T2 to address specific memory cells in the activated or opened row R1. At a time T3, the memory devices 114 in rank R1 place a first data word DW11 on the data bus DQ in response to the burst read command RD applied at the time T2. As will be appreciated by those skilled in the art, in response to the burst read command RD the memory devices 114 sequentially output a series or burst of data words on the data bus DQ. In the example of FIG. 2, the burst length is 4 and thus data words DW11, DW12, DW13, and DW14 are output from rank R1 at times T3, T4, T5, and T6, respectively, in response to the single burst read command RD applied at time T2.

The period from the times T1-T3 corresponds to the latency of the memory devices 114, which is the delay from when an ACT command is first applied to the memory devices until a first data word DW from the activated row is provided on the data bus DQ. The latency lowers the throughput on the data bus DQ since no data is transferred over the data bus from the times T1-T3. To eliminate the adverse effects of the latency on the throughput of the memory 104, and to efficiently use the data bus DQ (i.e. high bandwidth or memory bus efficiency) the memory controller 102 applies a new ACT and RD commands to one of the other ranks R2-R8 or another bank B2-B4 within the rank R1 while the rank R1 supplies the data words DW11-DW14 on the data bus DQ in response to the first burst read command RD at time T2. Thus, at the time T3 the memory controller 102 applies a second burst read command RD to activate rank R2 (the group of memory devices 114 on the memory module 106 coupled to chip select CS2#), bank B1, and row R1. The memory controller 102 thereafter applies a second burst read command RD at the time T5 to address specific memory cells in the activated row R1 in bank B1, rank R2. At a time T7, the memory devices 114 in rank R2 place a first data word DW21 on the data bus DQ in response to the second burst read command RD applied at the time T5, and successive data words DW22, DW23, DW24 at times T8, T9, and T10, respectively.

The memory controller 102 continues operating in this manner to apply ACT and RD commands to open new rows of memory cells in new memory banks B1-B4 in the ranks R1-R8 while data word DW from prior ACT and RD commands is being placed on the data bus DQ. If the burst length is 4 as in FIG. 2, the memory controller 102 is able to hide the latency of the memory devices 114 and increase the throughput of the memory 104 by accessing the memory 104 in this manner. The memory controller 102 continues applying ACT, RD commands to open new rows in new memory banks B1-B4 until all memory banks have been accessed. In the example of FIG. 2, the memory 104 includes 8 ranks R1-R8, each including four banks B1-B4 for a total of 32 banks that can be activated by the controller. After accessing data in each of the 32 banks, the memory controller 102 must begin closing the open rows in each of the banks and accessing new rows to continue reading data words DW from the memory 104. This is true assuming that subsequent accesses are "page misses," meaning that the subsequent access are to memory cells contained a row other than the open row the banks.

At a time T14, the memory controller 102 applies a precharge command PRE to close the open row R1 in bank B1 in rank R1. In the response to the PRE command, the corresponding memory devices 114 deactivate or close the currently open row, and charge nodes and reset circuits in the memory device in anticipation of a next row being opened, as will be understood by those skilled in the art. In the following description, the term precharge will be used to mean a respective bank B1-B4 in a selected rank R1-R8 closes the currently open row, charges appropriate nodes, and resets appropriate circuits to thereby place the bank in condition to open a subsequent row. Because the memory controller 102 must now apply PRE commands to the memory 104, the flow of data words DW on the data bus DQ is interrupted, lowering the throughput of the memory system. This is true because the memory controller 102 is unable to apply consecutive ACT, RD commands at the required times to maintain a continuous flow of data words DW on the data bus DQ due to the need to begin applying precharge commands PRE to the memory 104. Thus, the data bus DQ efficiency drops because the system is command bandwidth limited.

As illustrated in FIG. 2, the memory controller 102 applies the PRE command at the time T14 and must thereafter wait a row precharge time TRP before applying a new ACT command to the rank R1 at a time T15. While the PRE command at time T14 can be applied early enough to eliminate or "hide" the row precharge time TRP and latency of rank R1, bank B1, a gap during which no data words DW are placed on the data bus DQ will still appear due to the PRE command. This gap is illustrated in FIG. 2 between a time T16 at which the final data word DW324 is placed on the data bus DQ and a time T17 at which the final data word DW from rank R1 is placed on the data bus. There are no data words DW on the data bus DQ from the time T16 until the time T17, and such a gap occurs on the data bus DQ for each of the ranks R1-R8.

Figure 3:
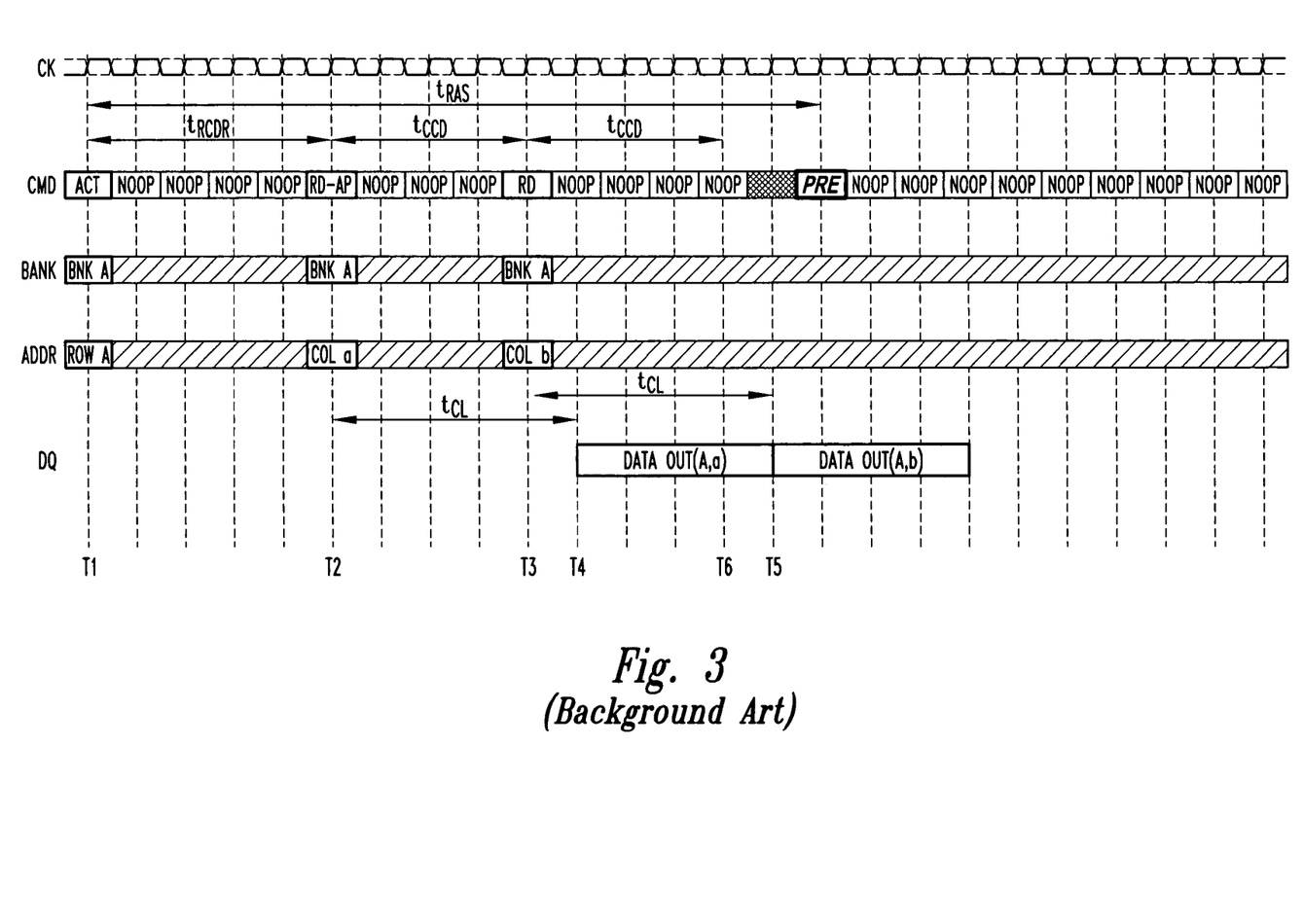
FIG. 3 is a signal timing diagram illustrating one approach of performing auto precharge operations in the memory system of FIG. 1.

To eliminate the need of applying a separate precharge command PRE to precharge banks within the memory 104, a read-auto precharge command RD-AP was developed. The RD-AP command is a separate command that may be applied by the memory controller 102 instead of the standard read command RD. In response to the RD-AP command, the memory 104 automatically precharges a corresponding bank unless another read command RD or a write command WR is applied to the bank within a column-to-column delay time TCCD, as will now be explained in more detail with reference to FIG. 3. FIG. 3 is a signal timing diagram illustrating the operation of the memory 104 where the memory system is adapted to receive RD-AP commands. The memory 104 whose operation is illustrated in FIG. 3 is a synchronous system and thus a clock signal CK is shown. At times T1 and T2, the memory controller 102 applies ACT and RD-AP commands, respectively, to a selected bank B1-B4 and rank R1-R8 in the memory 104, and at a time T3 the memory controller applies a standard read command RD to the selected bank to access different columns of memory cells within the opened row. The standard RD command corresponds to a "page hit," meaning the controller 102 accesses different columns in the open row or "page" of memory cells. The memory controller 102 applies the RD command within the time TCCD of the RD-AP command, and thus no precharge is performed at this point even though the memory controller has apply the RD-AP command. At times T4 and T5 bursts of data words DW are applied on the data bus DQ responsive to the RD-AP and RD commands, respectively.

The column-to-column delay time TCCD occurs at a time T6 after the RD command is applied at the time T3, and at this point the memory controller 102 fails to apply another RD command or a write command WR to the selected bank B1-B4, rank R1-R8. As a result, the memory devices 114 in the selected bank B1-B4 automatically precharge so that this bank is ready to open a new row in response to a subsequent ACT command from the memory controller 102. In this way, each of the 32 banks B1-B4 in the ranks R1-R8 automatically precharge without requiring the memory controller 102 to supply a separate PRE command to the bank, which improves the throughput of the memory 104 by reducing periods during which no data words DW may be placed on the data bus DQ. The RD-AP command places the selected bank B1-B4 and rank R1-R8 in what is known as a persistent auto precharge mode of operation, meaning that after the RD-AP command is applied the bank will be precharged automatically (the precharge "persists") unless the precharge is "held off" or delayed by applying a RD or WR command within the time TCCD. While the separate RD-AP and WR-AP command approach eliminates the need to apply a separate PRE command to the memory 104, two additional commands in the form of the RD-AP and WR-AP commands are nonetheless required and must be applied at appropriate times to increase the throughput of the memory system as desired. These factors increase the overall complexity of the memory 104 described with reference to FIG. 3.

Figure 4:
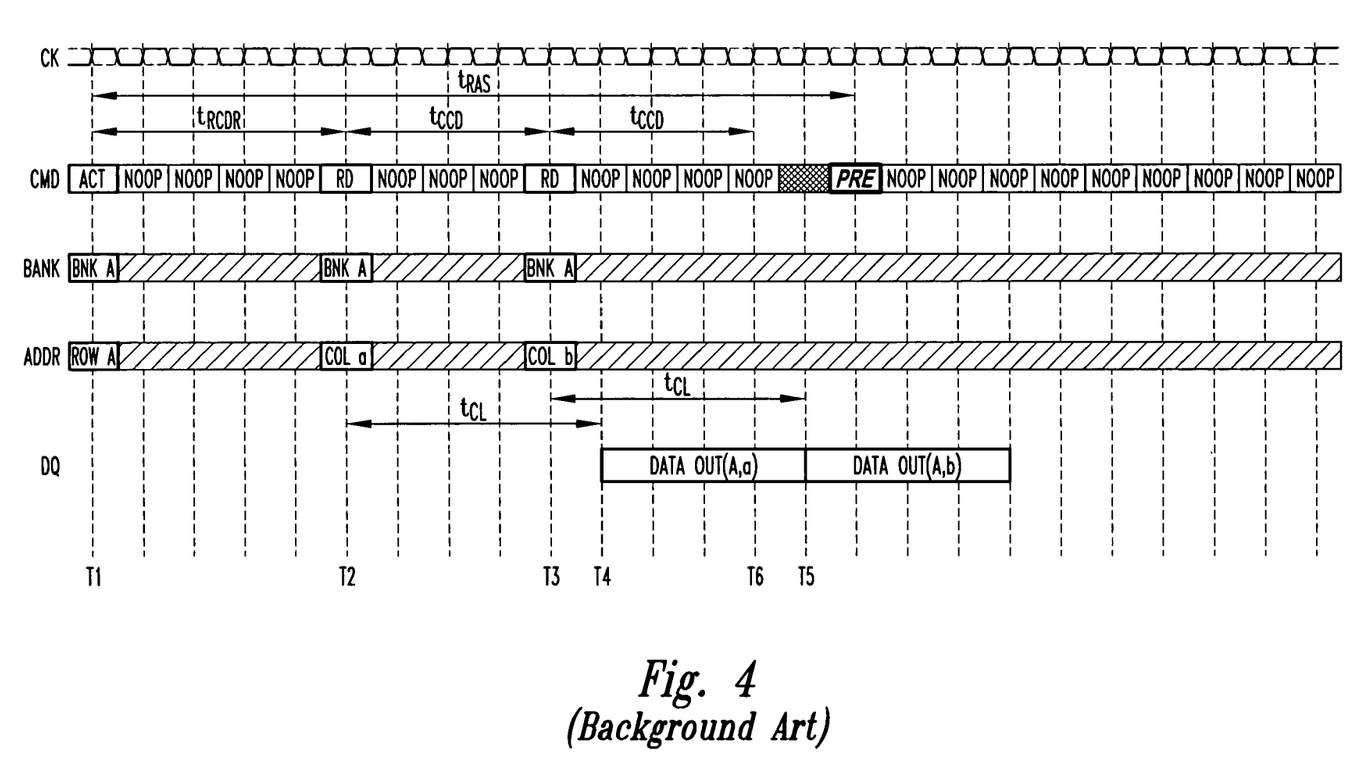
FIG. 4 is a signal timing diagram illustrating another approach of performing auto precharge operations in the memory system of FIG. 1.

Another approach that eliminates the need to apply separate precharge PRE and read auto-precharge RD-AP commands is illustrated in the timing diagram of FIG. 4 which shows the operation of the memory 104 where the memory system 100 utilizes persistent auto precharge to automatically precharge banks B1-B4 of the memory system. In the memory system 100 whose operation is illustrated in FIG. 4, each RD command places the selected bank B1-B4 and rank R1-R8 in a persistent auto precharge mode, and unless another read RD or write WR command is applied within the column-to-column delay time TCCD the bank is precharged. The system 100 operates in the same manner as described with reference to FIG. 3, except no separate RD-AP command need be applied to place the memory 104 in the persistent auto precharge mode of operation. At the time T6, which occurs the time TCCD occurs after the RD command is applied at the time T3, no RD or write command WR is applied to the selected bank B1-B4 and rank R1-R8, and thus the selected bank precharges automatically. With this approach, no separate precharge PRE or read auto precharge RD-AP command is required, which once again improves the throughput of the memory 104 by reducing periods during which no data words DW may be placed on the data bus DQ for the same reasons discussed above with reference to FIG. 3.

Some applications, like graphics applications or transferring data to and from a mass storage device like a hard disk, include a lot of page hits, meaning the memory controller 102 accesses multiple addresses in each open row or page. In contrast, some applications, such as server applications, typically access single addresses in each open row. The persistent auto precharge methodology was developed to allow the same memory 104 to be utilized in both types of applications: auto precharge can be delayed in graphics-type applications to keep pages open and pages can be automatically closed in server-type applications. While the persistent auto precharge methodologies described with reference to FIGS. 3 and 4 improve throughput in some applications, both approaches result in a lower throughput when used in applications requiring error checking and correction (ECC) which, in turn, requires read-modify-write operations be performed, as will now be explained in more detail. In a memory 104 including ECC, the data bus DQ may, for example, be 72 bits wide with eight bits or one byte being an ECC byte and 64 bits corresponding to a data word DW. For example, each bit in the ECC byte could be a parity bit for a corresponding one of the eight bytes in the 64-bit data word. The memory controller 102 performs read-modify-write operations to change only selected bytes of data in the 64-bit data word DW and store this modified data in the memory 104. For example, the memory controller 102 may need to modify only six of the eight bytes in a particular 64-bit data word DW. To modify these six bytes, the memory controller 102 reads the 64-bit data word DW along with the 8-bit ECC byte and combines the six new bytes with the two old bytes to form a new 64-bit data word DW. The memory controller 102 recalculates the value of the ECC byte for the new data word DW and writes the new 64-bit data word along with the new ECC byte back to the memory 104. The time the memory controller 102 requires to read data word DW and ECC byte, merge the old and new data bytes to form a new data word, and recalculate the ECC byte is longer than the column-to-column delay time TCCD. As a result, if a RD command (FIG. 4 system) or RD-AP command (FIG. 3 system) is applied to a selected bank B1-B4 and rank R1-R8, the selected bank will precharge before the memory controller 102 is able to write the modified data word DW back into the open row. The memory controller 102 must therefore apply a new ACT command to once again open the same row in the selected bank B1-B4 and rank R1-R8, which results in a delay in the operation of the memory system 100 while the memory controller waits for the selected row to be reopened. This delay lowers the throughput of the memory 104.

There is a need for a memory system that provides persistent auto precharge features while also allowing read-modify-write operations to be efficiently performed.

SUMMARY OF THE INVENTION

One aspect of the invention provides a method including operating a memory device in a persistent auto precharge mode where a precharge operation is executed unless a memory access command is received during a delay time following a previous memory access command, and suspending the persistent auto precharge mode of operation when a precharge command is received during the delay time following the previous memory access command. Another aspect of the invention provides a method including automatically precharging a row of memory cells of a memory device following each data transfer operation on the row of memory cells that involves opening the row of memory cells and keeping the row of memory cells open when a precharge command is received within a predetermined period of time following a previous data transfer command.

Another aspect of the invention provides a memory device having an array of memory cells and a control circuit coupled to the array of memory cells. The control circuit is operable to operate the memory device in a persistent auto precharge mode where a precharge operation is executed unless a memory access command is received during a delay time following a previous memory access command The control circuit is further operable to suspend the persistent auto precharge mode of operation when a precharge command is received during the delay time following the previous memory access command.

Another aspect of the invention provides a memory device including an array of memory cells arranged in rows and columns and a control circuit coupled to the array of memory cells. The control circuit is operable to automatically precharge a row of memory cells following each data transfer operation on the row of memory cells that involves opening the row of memory cells and the control circuit is further operable to keep the row of memory cells open when a precharge command is received during a predetermined period of time following a previous data transfer command.

DETAILED DESCRIPTION OF THE INVENTION

Figure 5:
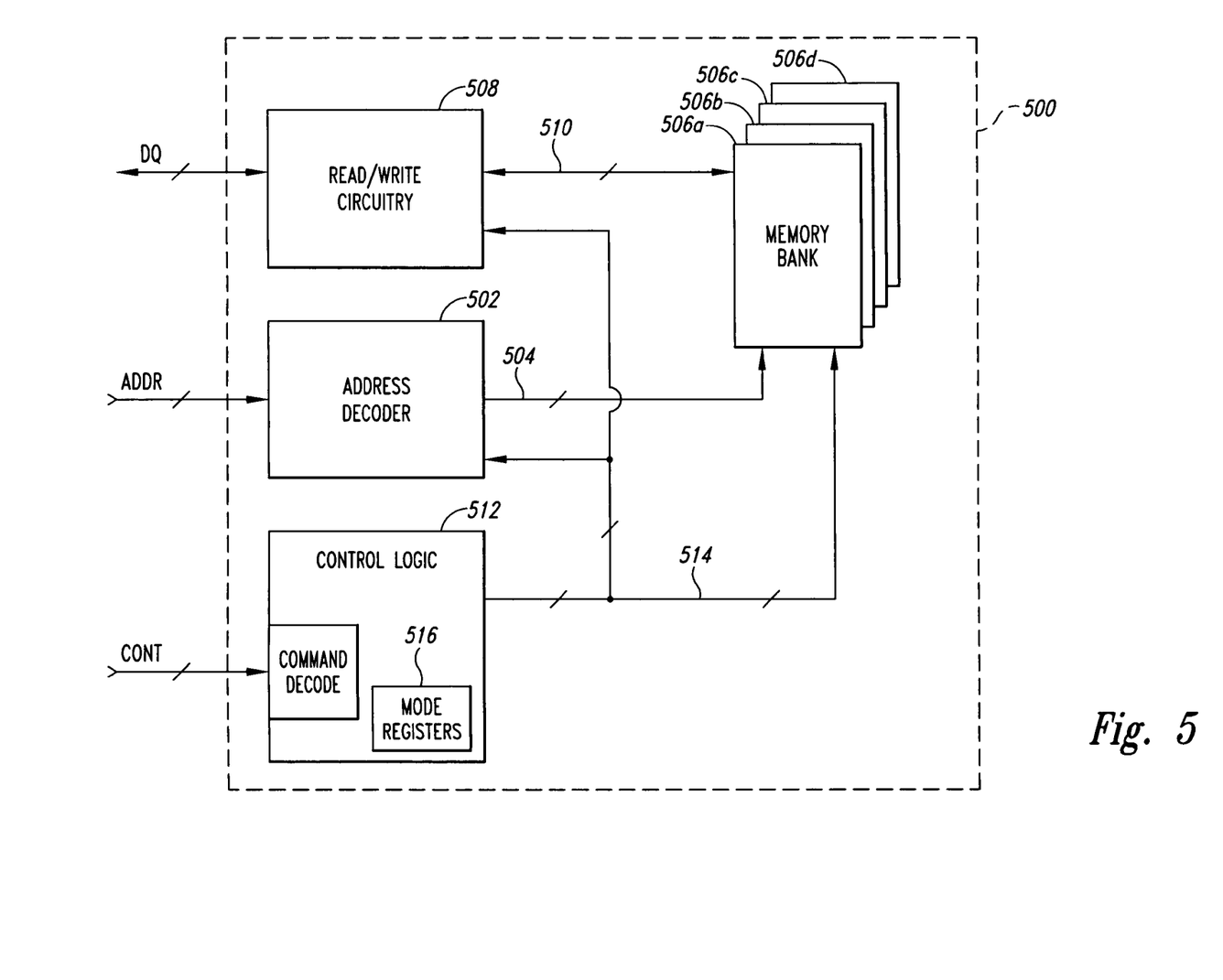
FIG. 5 is a functional block diagram illustrating a memory device having a modified persistent auto precharge command protocol which may be used in the memory system of FIG. 1 according to one embodiment of the present invention.

FIG. 5 is a functional block diagram of a memory device 500 that utilizes a modified persistent auto precharge command protocol according to one embodiment of the present invention. Unlike the persistent auto precharge command protocols previously discussed, the modified protocol does not require a specialized command to place the memory device 500 in a persistent auto precharge mode of operation, and also allows auto precharge to be delayed during read-modify-write operations to enable write data to be written to an open row without the need to reopen the row, as will be explained in more detail below. The memory device 500 can be used in place of the memory devices 114 in the memory system 100 of FIG. 1. In the following description, certain details are set forth to provide a sufficient understanding of the present invention, but one skilled in the art will appreciate that the invention may be practiced without these particular details. In other instances, the operation of well known components have not been shown or described in detail to avoid unnecessarily obscuring the present invention.

The memory device 500 includes an address decoder 502 that receives address bits A0-AX on an address bus ADDR and decodes these address bits and applies decoded address signals 504 to a plurality of memory banks 506A-D. Each of the memory banks 506A-D includes a plurality of memory cells (not shown) arranged in rows and columns, each memory cell storing a bit of data. The data stored in the memory cells is accessed in response to the decoded address signals 504 from the address decoder 502. A read/write circuit 508 is coupled to the memory banks 506A-D through an internal data path 510 and is coupled to an external data bus DQ over which read data words DW are transferred from and to, respectively, the memory device 500. The operation and structure of the address decoder 502, memory banks 506A-D, and read/write circuitry 508 are conventional, and thus, for the sake of brevity, will not be described in more detail.

The memory device 500 further includes a control logic and command decoder 512 that receives a plurality of control and clocking signals over a control bus CONT, typically from the memory controller (not shown). The control signals typically include a chip select signal CS#, a write enable signal WE#, a column address strobe signal CAS#, and a row address strobe signal RAS#, while the clocking signals typically include a clock enable signal CKE# and complementary clock signals CLK, CLK#, with the "#" designating a signal as being active low. The memory controller drives the control signals CS#, WE#, CAS#, and RAS# to particular states and supplies the corresponding address signals A0-AX on the address bus ADDR to apply a command to the memory device 200, such as a read RD, write WR, precharge PRE, or activate ACT command. In response to the clock signals CLK, CLK#, the control logic and command decoder 512 latches and decodes the control signals portion of an applied command, and generates a sequence of clocking and control signals 514 that control the components 502, 506, 508 to execute the function of the applied command. The control logic and command decoder 512 also includes mode registers 516 that store information to define specific modes of operation of the memory device 500, such as the selection of a burst length, burst type, CAS latency. In one embodiment, the mode registers 516 also receive a precharge mode command that sets the persistent auto precharge mode of the memory device 500, as will be explained in more detail below.

Figure 6:
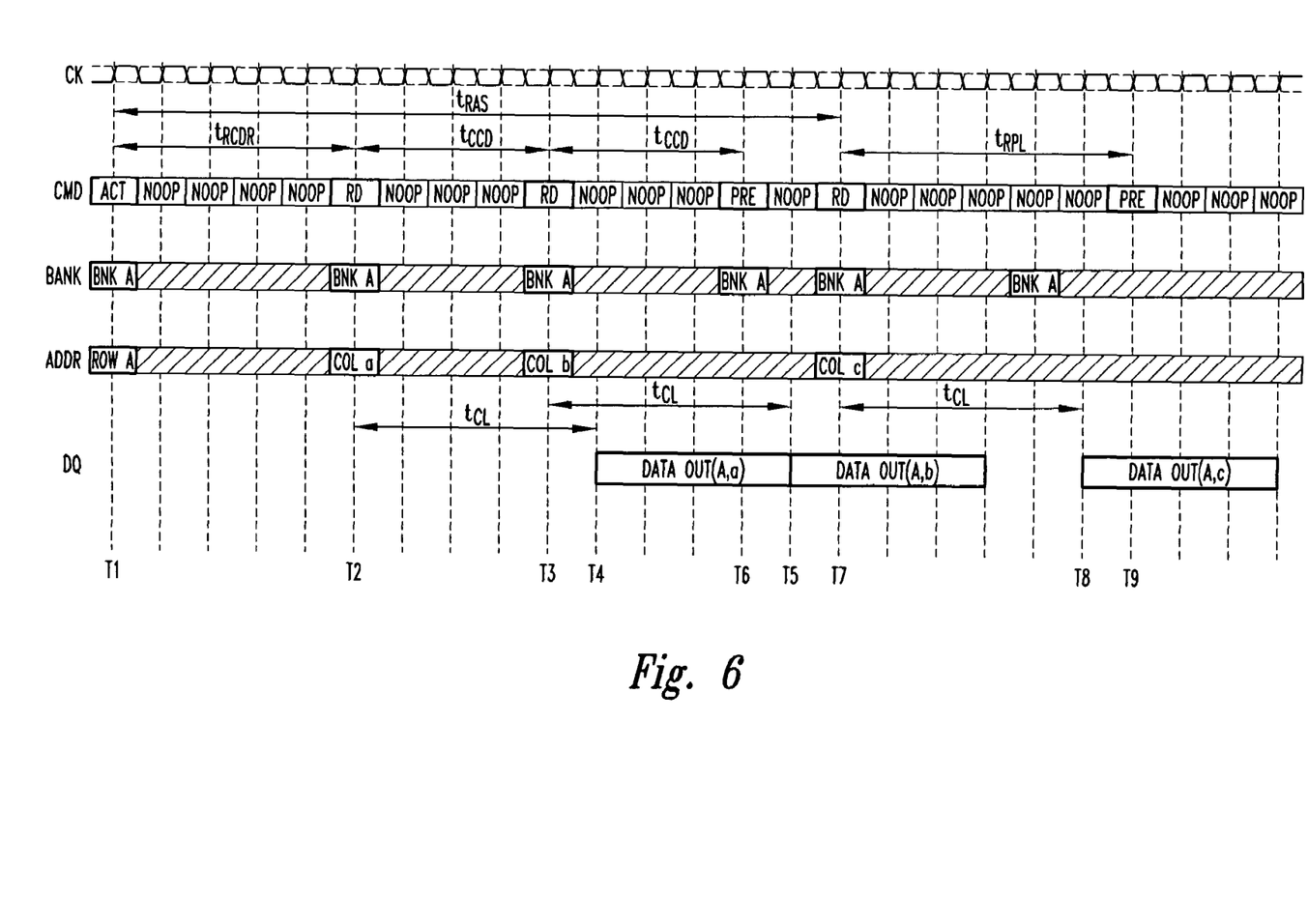
FIG. 6 is a signal timing diagram illustrating the operation of the memory device of FIG. 5 during read operations.

The operation of the memory device 500 will now be described in more detail with reference to the signal timing diagram of FIG. 6, which illustrates the operation of the memory device during read operations according to the modified persistent auto precharge command protocol. The memory device 500 would typically be used on the memory modules 106-112 of FIG. 1 in place of the memory devices 114. In the following description, however, the operation of the single memory device 500 is described, and one skilled in the art will appreciate the operation of the single memory device corresponds to the operation of each memory device in the memory system 100.

In operation, at a time T1 an active command ACT is applied to the memory device 500 over the CONT and ADDR busses. The active command ACT includes specific row and bank addresses, and of course includes the active low chip select signal CS# (see FIG. 1) to select the memory device 500. The address decoder 502 latches the applied bank and row address portion of the ACT command, and in response to the latched addresses generates decoded address signals 504 to activate the corresponding memory bank 506A-D and open the corresponding row in the activated bank. The control logic and command decoder 512 latches the control signal portion of the ACT command and generates control signals 514 to control the operation of the components 502, 506A-D, and 508 as required. In the following description, the operation of the control logic and command decoder 512 in response to each command will be omitted since for each applied command the control logic and command decoder controls the other components as required to execute the function of the applied command.

At a time T2, a first read command RD is applied to the memory device 500 and a column portion of the read command latched by the address decoder 502 which, in turn, decodes the column address to access a first group of memory cells in the open row. In the memory device 500, all read operations are persistent auto precharge operations, meaning that unless a subsequent read command RD is applied to the memory device within the column-to-column delay time TCCD, the device precharges the activated bank. In FIG. 6, a second read command RD is applied at a time T3, with the address decoder 502 accessing a second group of memory cells in the open row. The read/write circuit 508 receives the data words DW corresponding to the first group of memory cells accessed in response to the first read command RD, and places a burst of four data words on the data bus DQ starting at a time T4. Similarly, the read/write circuit 508 receives data words DW corresponding to the second group of memory cells accessed in response to the second read command RD, and places a burst of four data words on the data bus DQ starting at a time T5.

In the memory device 500, the persistent auto precharge mode of operation is disabled or turned OFF by applying a precharge command PRE within the column-to-column delay time TCCD when the memory device is operating in the persistent auto precharge mode. In the prior memory systems 100 discussed in FIGS. 1-4, application of a precharge command PRE is not allowed or invalid when the system is operating in the persistent auto precharge mode. In contrast, as shown in FIG. 6, in the memory device 500 a precharge command PRE is applied at a time T6 when the device is in the persistent auto precharge mode. In response to this PRE command at time T6, the control logic and command decoder 512 turns OFF the persistent auto precharge mode to place the memory device 500 in a normal precharge mode of operation. The normal precharge mode corresponds to the mode in which a precharge command PRE must be applied to the memory device 500 to recharge a selected memory bank 506A-D. By disabling the persistent auto precharge mode, a third read command RD can be applied at a time T7, which is greater than the time TCCD after the prior read command RD at time T3, to thereby access a third group of memory cells in the open row. In this way, consecutive read commands RD need not be applied to the memory device 500 within the column-to-column delay time TCCD in order to prevent auto precharge. The time between consecutive read commands RD can now be greater than the column-to-column delay time TCCD as long as a precharge command PRE is applied to turn OFF the persistent auto precharge mode of operation. The read/write circuit 508 places data words DW corresponding to the third read command RD at time T7 on the data bus DQ starting at a time T8.

The precharge command PRE applied at the time T6, which is within the column-to-column delay time TCCD of the prior read command RD at time T3, turns OFF the persistent auto precharge mode of operation and places the memory device 500 in the normal precharge mode of operation. As a result, a second precharge command PRE must be applied to the memory device 500 to precharge the open memory bank 506A-D, which occurs at a time T9 in FIG. 6. This second PRE command at time T9 resets the operating mode of the memory device 500 back to the persistent auto precharge mode of operation. Note that the precharge command PRE applied at time T6 to turn OFF the persistent auto precharge mode need not be applied precisely at time T6, but may be applied at other times during the read operations. For example, the PRE command could be applied at any time between the active command ACT applied at time T1 and the time T6.

Figure 7:
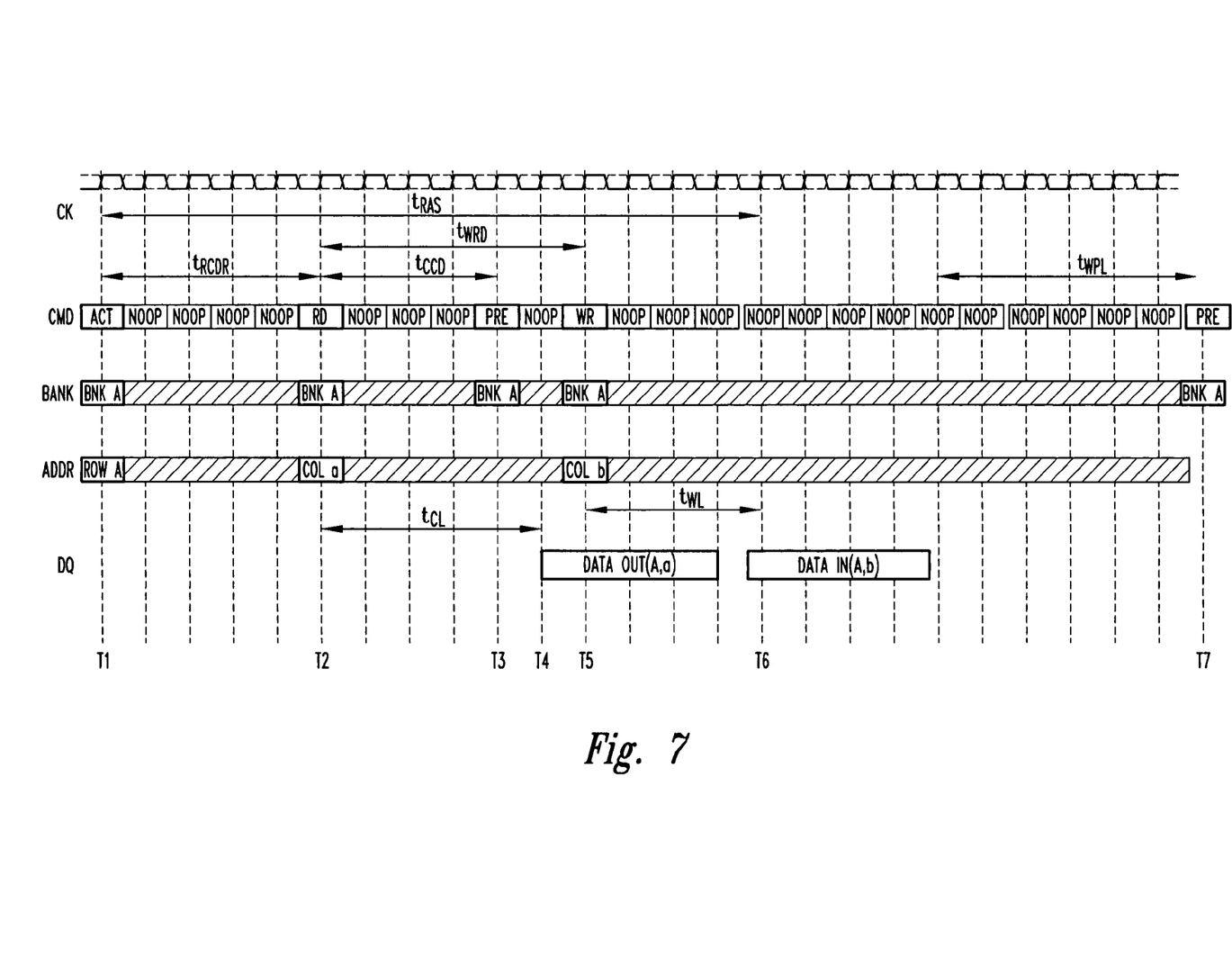
FIG. 7 is a signal timing diagram illustrating the operation of the memory of FIG. 5 during read-modify-write operations.

FIG. 7 is a signal timing diagram illustrating the operation of the memory device 500 during read-modify-write operations. An active command ACT is applied at a time T1 and a read command RD applied at a time T2, with the memory device 500 operating as previously described to access the addressed bank, row, and columns. Recall, during a read-modify-write operation, a memory controller reads data words DW and an error correcting code ECC word or byte from a selected bank and rank of memory, modifies selected bytes in the data words, recalculates the ECC byte, and writes the new ECC byte and modified data words back to the selected bank and rank. As previously described, each rank of memory would typically include a plurality of memory devices 500, with one of the memory devices in the rank storing the ECC byte and other ones of the memory devices storing respective bytes that collectively form the data words DW. In the following description, however, the operation of the memory device 500 during read-modify-write operations will be described as if both data words DW and the ECC byte are written to the single memory device merely to simplify the description of the memory device during read-modify-write operations.

The memory device 500 allows read-modify-write operations to occur without precharging a selected memory bank 506A-D and then reopening the same row in the bank prior to writing the modified data words DW and ECC byte to the row. After the read command RD at time T2, a precharge command PRE is applied at time T3 to disable the persistent auto precharge mode of operation and place the memory device 500 in the normal precharge mode. The precharge command PRE must be applied within the column-to-column delay time TCCD after the read command RD at the time T2, as previously discussed. At a time T4, the read/write circuit 508 begins placing the data words DW and ECC information corresponding to the read command RD applied at the time T2 onto the data bus DQ. The external circuit latches the data words DW and ECC information and operates as previously described to modify bytes in the data words and recalculate the ECC information. At a time T5, the external circuit applies a write command WR to the memory device 500 in anticipation of writing the modified data words DW and recalculated ECC information to the memory device. The address decoder 502 and control logic and command decoder 512 latch the write command WR and operate in a manner analogous to that previously described for a read operation to access corresponding memory cells in the selected memory bank 506A-D. At a time T6, the external circuit begins placing the modified data words DW and recalculated ECC information on the data bus DQ. The read/write circuit 508 latches the applied data words DW and ECC information and transfers them into the corresponding memory cells in the open row of the selected memory bank 506A-D. At this point, the memory device 500 operates in the normal precharge mode and thus a precharge command PRE must be applied to precharge the selected memory bank 506A-D, as previously discussed with reference to the read operations of FIG. 6.

The memory device 500 described with reference to FIGS. 6 and 7 allows non-consecutive read operations to occur and also allows read-modify-write operations to occur without the need to precharge and then activate a selected memory bank 506A-D. This increases the throughput of memory systems utilizing the memory device 500. For example, referring back to FIG. 6, by allowing nonconsecutive read commands RD to be applied to an activated memory bank 506A-D, the duration for which no data words DW are placed on the data bus DQ is shorter than in the prior memory systems of FIGS. 1-4. This is true because although the third read command RD applied at the time T7 does not occur within the time TCCD of the prior read command RD applied at the time T3, the corresponding row remains open and thus the memory cells corresponding to the third read command may be more quickly accessed and the corresponding data placed on the data bus DQ at the time T8. As a result, only a short gap of no data words DW being placed on the data bus DQ occurs between the end of the data words DW corresponding to the second read command RD and the time T8 at which the data words corresponding to the third read command start being placed on the data bus. Similarly, the memory device 500 reduces such gaps on the data bus DQ during read-modify-write operations by eliminating the need to precharge and then reopen a selected row. The default persistent auto precharge operation of the memory device 500 allows the memory device to be utilized in systems not requiring read-modify-write operations, and in systems, such as server applications, not typically having a large number of page hits.

Figure 8:
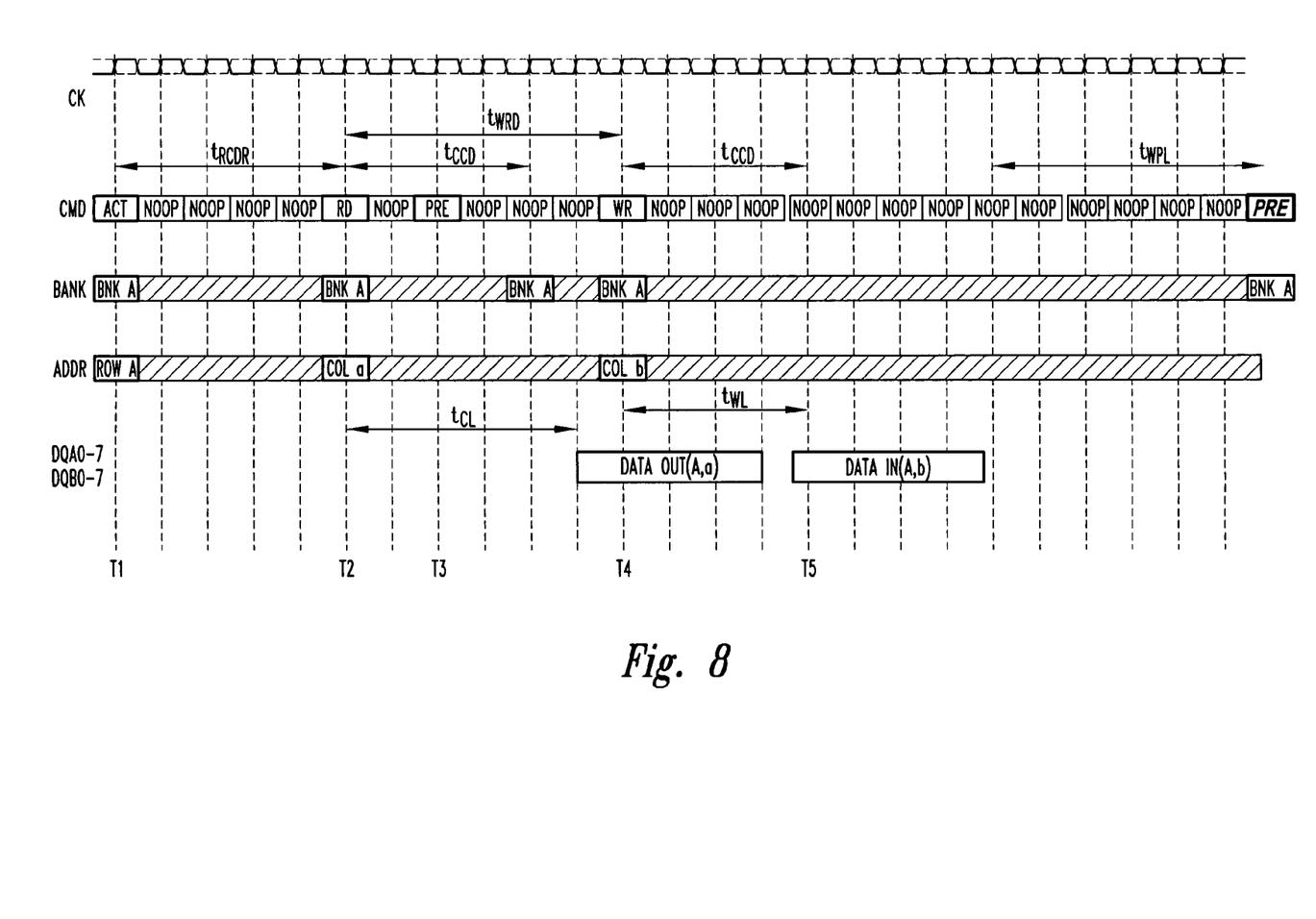
FIG. 8 is a signal timing diagram illustrating the operation of the memory device of FIG. 5 having another modified persistent auto precharge command protocol according to another embodiment of the present invention.

FIG. 8 is a signal timing diagram illustrating the operation of the memory device 500 of FIG. 5 using a second modified persistent auto precharge protocol according to another embodiment of the present invention. In this embodiment, the memory device 500 once again operates in the persistent auto precharge mode as a default. When a precharge command PRE is applied, the persistent auto precharge mode is once again turned OFF but only for a single read command RD or write command WR. In FIG. 8, and active command ACT and a read command RD are applied at times T1 and T2, respectively, and function as previously described. At a time T3, a precharge command PRE is applied, disabling the persistent auto precharge mode of operation. This allows a write command WR to be applied at a time T4 which is greater than the column-to-column delay time TCCD after the read command RD applied at time T2 without precharging the selected memory bank 506A-D, in the same way as previously described with reference to FIGS. 6 and 7. In this embodiment, however, once the write command WR is applied at the time T4, the memory device 500 once again enters the persistent auto precharge mode of operation. As a result, unless another command is applied within the time TCCD of the write command WR, which is designated time T5, the memory device precharges the activated memory bank 506A-D. Thus, in FIG. 8 the activated memory bank 506A-D is precharged at the time T5, which corresponds to the time TCCD after the applied write command WR, because no command has been applied to the memory device.

The embodiment of the memory device 500 described with reference to FIG. 8 disables the persistent auto precharge mode for only a single read or write command RD, WR in response to an applied precharge command PRE, in contrast to the embodiment described with reference to FIGS. 6 and 7 which permanently disabled persistent auto precharge mode in response to a precharge command. This embodiment may be used, for example, in server applications where page hits are relatively uncommon and thus the need to disable persistent auto precharge rarely arises. The embodiment of FIGS. 6 and 7, in contrast, may be used in applications where page hits arise more frequently, such as graphics applications, data input/output applications such as transferring data to and from a mass storage device, and applications where data is being transferred over a relatively slow data bus such as the peripheral component interconnect (PCI) bus.

In the memory device 500, the permanent or temporary disable of persistent auto precharge could be selected, for example, by supplying a precharge mode command to the memory device. In response to the precharge mode command, the control logic and command decoder 512 stores precharge mode information in the mode registers 516 to place the memory device in either the temporary or permanent disable auto precharge mode of operation. The control logic and command decoder 512 would thereafter control components 502, 506, 508 to operate in either the temporary or permanent disable auto precharge mode depending on the contents of the mode register. Alternatively, each memory device 500 could be permanently configured during manufacture to operate in either the temporary or permanent disable auto precharge mode.

Figure 9:
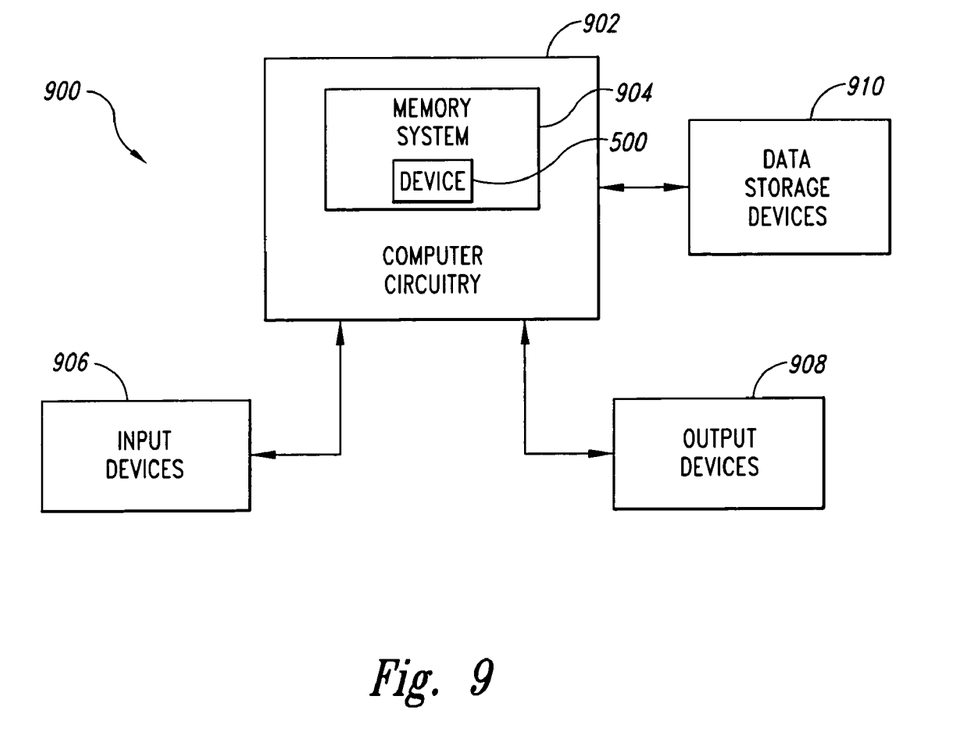
FIG. 9 is a functional block diagram illustrating a computer system including a memory system which includes the memory devices of FIG. 5.

The memory device 500 of FIG. 5 can be any of a number of different types of memory devices, such as an asynchronous dynamic random access memory (DRAM), synchronous DRAM (SDRAM), a double data rate (DDR) SDRAM, as well as packetized memory devices like SLDRAMs and RDRAMs, and the principles described herein are equally applicable to other types of memory and integrated circuits requiring the ability to efficiently access stored data in a variety of different applications. The memory device 500 may include fewer or greater number of components, and the functions performed by the components 502, 506, 508, 512 may be distributed differently among the components. Moreover, components other than the FIG. 9 is a block diagram of a computer system 900 including computer circuitry 902 that includes a memory system 904 containing memory device 500 of FIG. 5. The memory system 904 may, for example, be the system 100 if FIG. 1 where the memory devices 114 are replaced by the memory device 500. Typically, the computer circuitry 902 is coupled through address, data, and control buses to the memory system 904 to provide for writing data to and reading data from the memory system. The computer circuitry 902 includes circuitry for performing various computing functions, such as executing specific software to perform specific calculations or tasks. In addition, the computer system 900 includes one or more input devices 906, such as a keyboard or a mouse, coupled to the computer circuitry 902 to allow an operator to interface with the computer system. Typically, the computer system 900 also includes one or more output devices 908 coupled to the computer circuitry 902, such as output devices typically including a printer and a video terminal. One or more data storage devices 910 are also typically coupled to the computer circuitry 902 to store data or retrieve data from external storage media (not shown). Examples of typical storage devices 910 include hard and floppy disks, tape cassettes, compact disk read-only (CD-ROMs) and compact disk read-write (CD-RW) memories, and digital video disks (DVDs).

Even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

The invention claimed is:

1. A method, comprising:
operating a memory device in a persistent auto precharge mode where a precharge operation is executed unless a memory access command is received during a delay time following a previous memory access command; and
suspending the persistent auto precharge mode of operation when a precharge command is received during the delay time following the previous memory access command.

2. The method of claim 1, further comprising resuming the persistent auto precharge mode of operation subsequent to a persistent auto precharge mode enabling event.

3. The method of claim 2 wherein the persistent auto precharge mode enabling event comprises receiving a precharge command.

4. The method of claim 2 wherein the persistent auto precharge mode enabling event comprises executing a memory access operation subsequent to the precharge command.

5. The method of claim 4 wherein the memory access operation comprises the first memory access operation subsequent to the precharge command.

6. The method of claim 4 wherein the memory access operation comprises a read operation or a write operation.

7. The method of claim 1 wherein the delay time comprises a column-to-column delay time.

8. The method of claim 1 wherein suspending the persistent auto precharge mode of operation comprises placing the memory device in a normal precharge mode of operation where a precharge command is received to execute each precharge operation.

9. The method of claim 1 wherein operating the memory device in the persistent auto precharge mode comprises:
placing the memory device in the persistent auto precharge mode by applying a precharge mode command to the memory device; and
automatically executing a precharge operation after each memory access operation.

10. The method of claim 1 wherein operating the memory device in the persistent auto precharge mode comprises:
configuring the memory device to operate in the persistent auto precharge mode during manufacture of the memory device; and
automatically executing a precharge operation after each memory access operation.

11. A method, comprising:
automatically precharging in a persistent auto precharge mode a row of memory cells of a memory device following each data transfer operation on the row of memory cells that involves opening the row of memory cells; and
keeping the row of memory cells open when a precharge command is received within a predetermined period of time following a previous data transfer command.

12. The method of claim 11, further comprising resuming automatically precharging the row of memory cells following each data transfer operation on the row of memory cells subsequent to a predetermined event.

13. The method of claim 12 wherein the predetermined event comprises receiving a precharge command.

14. The method of claim 12 wherein the predetermined event comprises executing a data transfer operation subsequent to the precharge command.

15. The method of claim 14 wherein the data transfer operation comprises the first data transfer operation subsequent to the precharge command.

16. The method of claim 14 wherein the data transfer operation comprises a read operation or a write operation.

17. The method of claim 11 wherein the predetermined period of time comprises a column-to-column delay time.

18. The method of claim 11 wherein automatically precharging a row of memory cells of a memory device following each data transfer operation on the row of memory cells comprises:
   placing the memory device in a persistent auto precharge mode by applying a precharge mode command to the memory device; and
   automatically precharging the row of memory cells of the memory device after each data transfer operation on the row of memory cells.

19. The method of claim 11 wherein automatically precharging a row of memory cells of a memory device following each data transfer operation on the row of memory cells comprises:
   configuring the memory device to operate in a persistent auto precharge mode during manufacture of the memory device; and
   automatically precharging the row of memory cells of the memory device after each data transfer operation on the row of memory cells.

20. A memory device, comprising:
   an array of memory cells; and
   a control circuit coupled to the array of memory cells, the control circuit operable to operate the memory device in a persistent auto precharge mode where a precharge operation is executed unless a memory access command is received during a delay time following a previous memory access command, the control circuit further operable to suspend the persistent auto precharge mode of operation when a precharge command is received during the delay time following the previous memory access command.

21. The memory device of claim 20, further comprising:
   a read-and-write circuit coupled to the array of memory cells and the control circuit;
   an address decoder coupled to the array of memory cells and the control circuit;
   a data bus coupled to the read-and-write circuit;
   an address bus coupled to the address decoder; and
   a control bus coupled to the control circuit.

22. The memory device of claim 20 wherein the control circuit further operable to resume the persistent auto precharge mode of operation subsequent to a persistent auto precharge mode enable event.

23. The memory device of claim 22 wherein the persistent auto precharge mode enable event comprises receiving a precharge command.

24. The memory device of claim 22 wherein the persistent auto precharge mode enable event comprises executing a memory access operation subsequent to the precharge command.

25. The memory device of claim 24 wherein the memory access operation comprises the first memory access operation subsequent to the precharge command.

26. The memory device of claim 24 wherein the memory access operation comprises a read operation or a write operation.

27. The memory device of claim 20 wherein the delay time comprises a column-to-column delay time.

28. The memory device of claim 20 wherein the act to suspend the persistent auto precharge mode of operation comprises the act to place the memory device in a normal precharge mode of operation where a precharge command is received to execute each precharge operation.

29. The memory device of claim 20 wherein the memory device comprises a dynamic random access memory device.

30. A memory system, comprising:
   a memory module, the memory module including a plurality of memory devices, each of the plurality of memory devices operable in a persistent auto precharge mode where a precharge operation is executed unless a memory access command is received during a delay time following a previous memory access command, each of the plurality of memory devices further operable to suspend the persistent auto precharge mode of operation when a precharge command is received during the delay time following the previous memory access command; and
   a memory controller coupled to the memory module, the memory controller operable to apply address, data, and control signals to the memory module to access data stored in the plurality of memory devices, the memory controller further operable to apply the precharge command to selected memory devices of the plurality of memory devices to suspend the persistent auto precharge mode of operation in the selected memory devices.

31. The memory system of claim 30 wherein each of the plurality of memory devices further operable to resume the persistent auto precharge mode of operation subsequent to a persistent auto precharge mode enable event.

32. The memory system of claim 31 wherein the persistent auto precharge mode enable event comprises receiving a precharge command.

33. The memory system of claim 31 wherein the persistent auto precharge mode enable event comprises executing a memory access operation subsequent to the precharge command.

34. The memory system of claim 33 wherein the memory access operation comprises the first memory access operation subsequent to the precharge command.

35. The memory system of claim 33 wherein the memory access operation comprises a read operation or a write operation.

36. The memory system of claim 30 wherein the delay time comprises a column-to-column delay time.

37. The memory system of claim 30 wherein the act to suspend the persistent auto precharge mode of operation comprises the act to place the memory device in a normal precharge mode of operation where a precharge command is received to execute each precharge operation.

38. The memory system of claim 30 wherein each of the plurality of memory devices comprises a dynamic random access memory device.

39. The memory system of claim 30 wherein the memory controller performs read-modify-write operations by applying an active command to selected memory devices of the plurality of memory devices, a precharge command to the selected memory devices, a read command to the selected memory devices, and a write command to the selected memory devices.

40. The memory system of claim 39 wherein the memory controller applies the precharge command after the active command and prior to the read and write commands.

41. The memory system of claim 39 wherein the memory controller applies the precharge command after the read command.

42. The memory system of claim 30 wherein the memory module comprises a memory module having error checking and correction information.

43. A computer system, comprising:
a data input device;
a data output device;
a processor coupled to the data input and data output devices; and
a memory device coupled to the processor, the memory device comprising:
an array of memory cells; and
a control circuit coupled to the array of memory cells, the control circuit operable to operate the memory device in a persistent auto precharge mode where a precharge operation is executed unless a memory access command is received during a delay time following a previous memory access command, the control circuit further operable to suspend the persistent auto precharge mode of operation when a precharge command is received during the delay time following the previous memory access command.

44. The computer system of claim 43 wherein the memory device further comprising:
a read-and-write circuit coupled to the array of memory cells and the control circuit;
an address decoder coupled to the array of memory cells and the control circuit;
a data bus coupled to the read-and-write circuit;
an address bus coupled to the address decoder; and
a control bus coupled to the control circuit.

45. The computer system of claim 43 wherein the control circuit further operable to resume the persistent auto precharge mode of operation subsequent to a persistent auto precharge mode enable event.

46. The computer system of claim 45 wherein the persistent auto precharge mode enable event comprises receiving a precharge command.

47. The computer system of claim 45 wherein the persistent auto precharge mode enable event comprises executing a memory access operation subsequent to the precharge command.

48. The computer system of claim 47 wherein the memory access operation comprises the first memory access operation subsequent to the precharge command.

49. The computer system of claim 47 wherein the memory access operation comprises a read operation or a write operation.

50. The computer system of claim 43 wherein the delay time comprises a column-to-column delay time.

51. The computer system of claim 43 wherein the act to suspend the persistent auto precharge mode of operation comprises the act to place the memory device in a normal precharge mode of operation where a precharge command is received to execute each precharge operation.

52. The computer system of claim 43 wherein the memory device comprises a dynamic random access memory device.

53. A memory device, comprising:
an array of memory cells arranged in rows and columns; and
a control circuit coupled to the array of memory cells, the control circuit operable to automatically precharge in a persistent auto precharge mode a row of memory cells following each data transfer operation on the row of memory cells that involves opening the row of memory cells, the control circuit further operable to keep the row of memory cells open when a precharge command is received during a predetermined period of time following a previous data transfer command.

54. The memory device of claim 53, further comprising:
a read-and-write circuit coupled to the array of memory cells and the control circuit;
an address decoder coupled to the array of memory cells and the control circuit;
a data bus coupled to the read-and-write circuit;
an address bus coupled to the address decoder; and
a control bus coupled to the control circuit.

55. The memory device of claim 53 wherein the control circuit further operable to resume automatically precharging the row of memory cells following each data transfer operation on the row of memory cells subsequent to a predetermined event.

56. The memory device of claim 55 wherein the predetermined event comprises receiving a precharge command.

57. The memory device of claim 55 wherein the predetermined event comprises executing a data transfer operation subsequent to the precharge command.

58. The memory device of claim 57 wherein the data transfer operation comprises the first data transfer operation subsequent to the precharge command.

59. The memory device of claim 57 wherein the data transfer operation comprises a read operation or a write operation.

60. The memory device of claim 53 wherein the predetermined period of time comprises a column-to-column delay time.

61. The memory device of claim 53 wherein the memory device comprises a dynamic random access memory device.

62. A memory system, comprising:
a memory module, the memory module including a plurality of memory devices each having an array of memory cells arranged in rows and columns, each of the plurality of memory device operable to automatically precharge in a persistent auto precharge mode a row of memory cells following each data transfer operation on the row of memory cells that involves opening the row of memory cells, each of the plurality of memory devices further operable to keep the row of memory cells open when a precharge command is received during a predetermined period of time following a previous data transfer command; and
a memory controller coupled to the memory module, the memory controller operable to apply address, data, and control signals to the memory module to access data stored in the plurality of memory devices, the memory controller further operable to apply the precharge command to selected memory devices of the plurality of memory devices to suspend the persistent auto precharge mode of operation in the selected memory devices.

63. The memory system of claim 62 wherein each of the plurality of memory devices further operable to resume automatically precharging the row of memory cells following each data transfer operation on the row of memory cells subsequent to a predetermined event.

64. The memory system of claim 63 wherein the predetermined event comprises receiving a precharge command.

65. The memory system of claim 63 wherein the predetermined event comprises executing a data transfer operation subsequent to the precharge command.

66. The memory system of claim 65 wherein the data transfer operation comprises the first data transfer operation subsequent to the precharge command.

67. The memory system of claim 65 wherein the data transfer operation comprises a read operation or a write operation.

68. The memory system of claim 62 wherein the predetermined period of time comprises a column-to-column delay time.

69. The memory system of claim 62 wherein each of the plurality of memory devices comprises a dynamic random access memory device.

70. The memory system of claim 62 wherein the memory controller performs read-modify-write operations by applying an active command to selected memory devices of the plurality of memory devices, a precharge command to the selected memory devices, a read command to the selected memory devices, and a write command to the selected memory devices.

71. The memory system of claim 70 wherein the memory controller applies the precharge command after the active command and prior to the read and write commands.

72. The memory system of claim 70 wherein the memory controller applies the precharge command after the read command.

73. The memory system of claim 62 wherein the memory module comprises a memory module having error checking and correction information.

74. A computer system, comprising:
  a data input device;
  a data output device;
  a processor coupled to the data input and data output devices; and
  a memory device coupled to the processor, the memory device comprising:
    an array of memory cells arranged in rows and columns; and
    a control circuit coupled to the array of memory cells, the control circuit operable to automatically precharge in a persistent auto precharge mode a row of memory cells following each data transfer operation on the row of memory cells that involves opening the row of memory cells, the control circuit further operable to keep the row of memory cells open when a precharge command is received during a predetermined period of time following a previous data transfer command.

75. The computer system of claim 74 wherein the memory device further comprising:
  a read-and-write circuit coupled to the array of memory cells and the control circuit;
  an address decoder coupled to the array of memory cells and the control circuit;
  a data bus coupled to the read-and-write circuit;
  an address bus coupled to the address decoder; and
  a control bus coupled to the control circuit.

76. The computer system of claim 74 wherein the control circuit further operable to resume automatically precharging the row of memory cells following each data transfer operation on the row of memory cells subsequent to a predetermined event.

77. The computer system of claim 76 wherein the predetermined event comprises receiving a precharge command.

78. The computer system of claim 76 wherein the predetermined event comprises executing a data transfer operation subsequent to the precharge command.

79. The computer system of claim 78 wherein the data transfer operation comprises the first data transfer operation subsequent to the precharge command.

80. The computer system of claim 78 wherein the data transfer operation comprises a read operation or a write operation.

81. The computer system of claim 74 wherein the predetermined period of time comprises a column-to-column delay time.

82. The computer system of claim 74 wherein the memory device comprises a dynamic random access memory device.

* * * * *